United States Patent [19]
Hayes et al.

[11] B 3,981,346
[45] Sept. 21, 1976

[54] METHOD AND APPARATUS FOR DIRECTIONAL SOLIDIFICATION

[75] Inventors: Douglas R. Hayes, Vernon; James S. Perron, Chester, both of Conn.

[73] Assignee: United Technologies Corporation, Hartford, Conn.

[22] Filed: Oct. 3, 1974

[21] Appl. No.: 511,885

[44] Published under the second Trial Voluntary Protest Program on January 27, 1976 as document No. B 511,885.

[52] U.S. Cl. .............................. 164/60; 164/127; 164/361; 164/364
[51] Int. Cl.² ...................................... B22D 25/06
[58] Field of Search ............ 164/60, 125, 127, 338, 164/361, 364; 249/111

[56] References Cited
UNITED STATES PATENTS

| | | | |
|---|---|---|---|
| 3,514,069 | 5/1970 | Daley | 249/111 |
| 3,532,155 | 10/1970 | Kane et al | 164/60 |
| 3,678,988 | 7/1972 | Tien et al | 164/49 |

*Primary Examiner*—Francis S. Husar
*Assistant Examiner*—John E. Roethel
*Attorney, Agent, or Firm*—Charles A. Warren

[57] ABSTRACT

In making columnar grained castings the shell mold is spaced from the chill plate by a ceramic ring on which the mold is positioned, the ring being made thicker and/or of a different ceramic from the mold to withstand the thermal stress developing while the mold is being heated for pouring, so that the mold, not being subjected to such stresses at the base, may be made thinner for producing better castings. In this way the best mold material for the purpose may be selected, as, for example, a material to have no reaction with the alloy and, by lowering the thermal gradient decrease the likelihood of mold failure.

10 Claims, 5 Drawing Figures

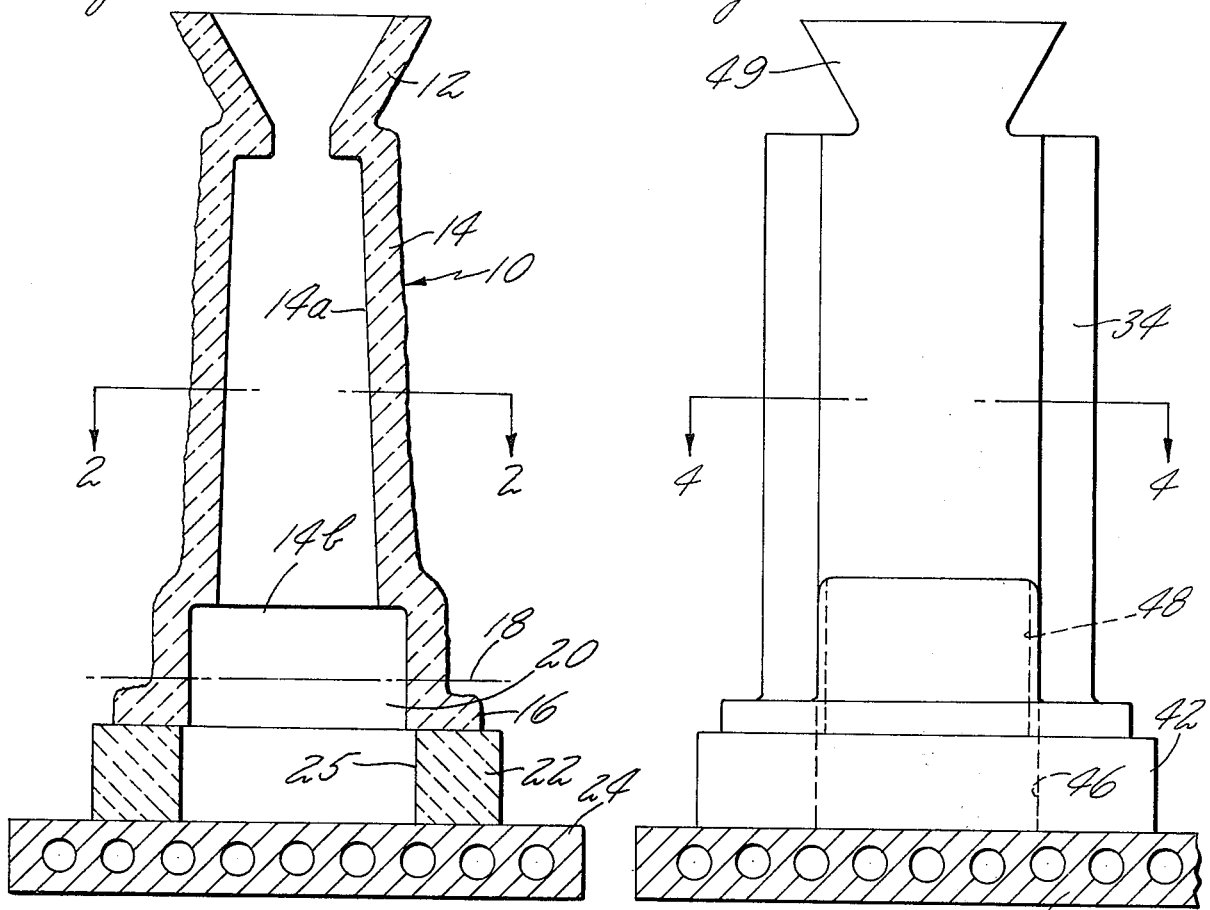

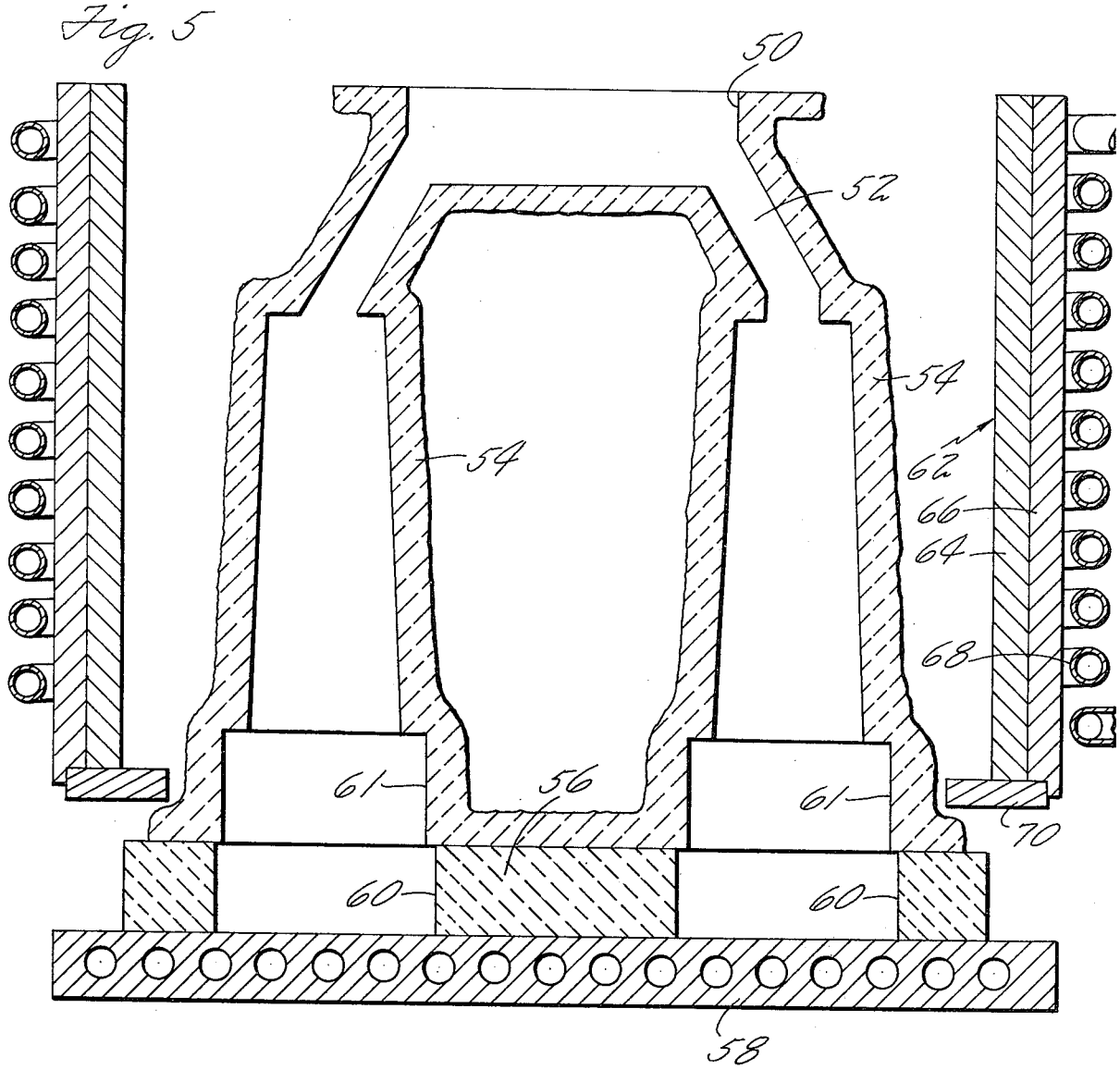

METHOD AND APPARATUS FOR DIRECTIONAL SOLIDIFICATION

BACKGROUND OF THE INVENTION

When making columnar grained castings the mold is positioned on a chill plate and then heated to a temperature above the melting point of the alloy before filling the mold with molten alloy. The chill plate is used to insure the start of solidification in columnar form at the surface of the chill plate and columnar grain growth is continued upwardly by a steep thermal gradient moving upwardly from the chill plate as, for example, by changing the temperature surrounding the mold or by withdrawing the mold downwardly from within the heating chamber for the mold.

High thermal stresses develop in the mold where it rests on the chill plate and routinely the mold is made thick enough and/or of a suitable ceramic to avoid cracking from such stresses. Such thickness of the mold wall affects the rate of cooling during solidification of the alloy thereby affecting the grain structure. The ceramic used may also have a reaction with the molten alloy, thereby affecting the chemistry of the cast article.

SUMMARY OF THE INVENTION

The present invention involves spacing the mold from the chill plate by a ceramic spacer ring that has an opening therein as large as the cavity in the mold at the base so that the columnar grain growth may start within the ring and continue upwardly into the mold. This ring may be thick enough to withstand the thermal stresses that develop therein and/or it may be made of a strong ceramic that will not be damaged by the thermal stresses. Since the part of the casting within the ring is not part of the usable cast article the ceramic for the ring need not be a material with no reaction to the alloy nor need it have the same finish on the internal surface as required in the mold.

The use of this ring permits the mold itself to be made only strong enough to contain the alloy and thus the mold may be thinner than usual and/or made of a ceramic that, although weaker, will not react with the molten alloy so that the alloy will not be affected detrimentally.

This ring may be of such a height as to space the mold base enough from the chill plate to minimize any thermal stresses in the mold as the entire mold may now be heated to the desired pouring temperature, with the temperature differential between this temperature and the chill plate all being concentrated within the ring.

The foregoing and other objects, features, and advantages of the present invention will become more apparent in the light of the following detailed description of preferred embodiments thereof as illustrated in the accompanying drawing.

BRIEF DESCRIPTION OF THE DRAWING

FIG. 1 is a vertical sectional view through the mold, ring and chill plate.

FIG. 2 is a sectional view along line 2—2 of FIG. 1.

FIG. 3 is an elevational view of a modification.

FIG. 4 is a sectional view along line 4—4 of FIG. 3.

FIG. 5 is a vertical sectional view through another modification.

DESCRIPTION OF THE PREFERRED EMBODIMENT

The arrangement shown is particularly adapted for producing columnar grained articles as described in VerSnyder, U.S. Pat. No. 3,260,505 or the specific type of columnar grain, the single crystal article of Piearcey, U.S. Pat. No. 3,494,709 and has use in the casting of high temperature superalloys, examples of which are given in these two patents. The arrangement also has utility in casting articles of eutectics as described in Lemkey, U.S. Pat. No. 3,793,010 and may be useful in making fine grained equiaxed articles where high quality and precise dimension are requirements.

Referring to FIG. 1, the mold 10 is the well-known shell mold construction, having a pouring cup 12 at the top, an article portion 14 which in the drawing is shown as a turbine blade having the airfoil portion 14a and the root portion 14b, the latter terminating above the base 16 of the mold substantially at the dotted line 18. Below the root portion 14b is a growth zone 20 opening at the base of the mold. This mold may be made by the usual lost-wax process in which a wax pattern is dipped in a ceramic slurry, coated with ceramic particles and then dried, with this dipping, coating and drying repeated to build up several layers of ceramic that when fully dried and cured will have adequate strength to contain the alloy when it is poured therein. Obviously the innermost layer or layers may be made of different ceramic than the remainder to produce the desired inner surface on the mold for a satisfactory surface on the finished casting. Also, the inner or all of the layers may be made of a ceramic that will have no undesirable reaction with the molten alloy.

The mold 10 rests on a ring 22 that in turn rests on the chill plate 24. The ring 22 is shown as having a vertical cavity 25 preferably corresponding in shape to the growth cavity at the base of the mold and at least as large in horizontal dimension to assure a crystalline growth vertically from the chill plate into the growth cavity. This ring is made of ceramic material and is preferably a high strength, high thermal resistance ceramic that will withstand the temperature differential between the high pouring temperature of the mold and the relatively cold chill plate. It will be understood that the mold is regularly heated to a temperature above the melting point of the alloy before the mold is filled. By using this ring to relieve the mold of these thermal stresses, the mold may be thinner for better heating and cooling and may be made of the best ceramic for the alloy being cast. Thus there is less restriction on the ceramics used for the mold.

In one form of the mold, the ring was made of a low density aluminum oxide and was about ½ inch high. The mold was a silica-zircon mold although alumina and magnesia materials are equally usable. The height of the ring was selected so that the steep thermal difference between the mold temperature, at pour, and the chill plate temperature can be accommodated without damage to the ring. Actual tests showed that the rings of high density alumina would function as desired if they were about ⅜ to ½ inch in height. The thickness of the ring appeared not to be critical except that it be thick enough to prevent cracking from the stresses therein. Both height and thickness would depend somewhat on the physical properties and conductivity of the ceramic when ready to use.

The invention is also applicable to the precast mold made up of two or more preformed ceramic parts as described in the copending application of Phipps et al U.S. Ser. No. 416,563, filed Nov. 16, 1973. As shown in FIGS. 3 and 4 the mold 30 is made up of mating plates 32 and 34 defining the opposite outer surfaces of cavities 36 and 38. These cavities produce the opposed halves of a hollow turbine blade, in the example shown. A central mold element 40 provides the inner surfaces for the mold cavities 36 and 38 and thus defines the inner surfaces of the finished blade.

To prevent the development of high thermal stresses in this mold during heating for pouring the alloy, the mold rests on a ring 42 that in turn rests on the chill plate 44. This ring has a vertical opening 46 at least as large as the mold cavities at the base 48 of the mold, and the height of the ring is such as to remove the chilling effect of the chill plate from the mold itself during heating of the mold. Thus, the high temperature difference between the chill plate and the mold at the time of pouring is all located within the ring and the mold is relieved of the thermal stresses that would occur in and near the base of the mold if it were placed directly on the chill plate. The mold may have an integral filling cup 49.

Many columnar grained articles are cast in multiple part molds as shown in FIG. 5. Thus the mold of this figure has a single pouring cup 50 connected by feeder tubes 52 to several article mold portions 54 located in parallel relation to one another. These mold portions are open at the base of the mold as in FIG. 1 and the base of the mold rests on a spacer or ring 56 that in turn rests on the chill plate 58. This spacer has a plurality of vertical openings 60 corresponding in shape and location to the openings 61 at the bottom of the article portions of the mold. The function of this spacer or ring is the same as described above.

In use, the mold and ring are mounted on a chill plate as shown in FIG. 5. In this figure the chill plate is vertically movable by means not shown, to permit the mold to be positioned in a furnace or heater 62, only one wall of which is shown. This furnace wall may be a susceptor cylinder 64 surrounded by suitable insulation 66 and in turn surrounded by an induction coil 68. At the base of the wall is an inwardly extending radiation shield 70, the inner edge of which overlies the chill plate and extends close to the mold wall at this point.

When the mold is in the position of FIG. 5 the mold is heated to a temperature a few hundred degrees above the melting point of the alloy while the chill plate remains relatively cool. This induces severe thermal stresses in the ring which must accept the mold temperature at the top and the chill plate temperature at the bottom. For example, in pouring superalloys of the type set forth in VerSnyder or Piearcey, above cited, the mold temperature may be as high as 2700°F or 2800°F.

When the mold reaches the desired pouring temperature the molten alloy is poured into the mold and solidification begins at the chill plate. As the alloy begins to solidify the chill plate is gradually lowered to withdraw the mold from the furnace, the rate of withdrawal being such as to keep the solidification front about at the level of the radiation shield. It will be understood that this form of casting is usually done in a vacuum chamber, the walls of which are regularly cooled and, as the mold is withdrawn from the furnace, the portions of the mold below the radiation shield may radiate heat rapidly to the cooled walls for faster removal of heat from the mold.

The growth zone extends upwardly from the chill plate as described in U.S. Pat. No. 3,417,809 to Sink and with the use of the spacer ring a part at least of the growth zone may be within the ring making it possible to decrease the height of the portion of the lower part of the mold forming the growth zone. Thus, in FIG. 1, the growth zone is shown to be much shorter than the usual growth zone. The remainder of the growth zone is in the ring. Shortening the mold makes possible a reduction in the percentage of cast alloy that is not a part of the cast usable article, thereby also reducing the amount of alloy used in making each casting.

Although the invention has been shown and described with respect to a preferred embodiment thereof, it should be understood by those skilled in the art that other various changes and omissions in the form and detail thereof may be made therein without departing from the spirit and scope of the invention.

Having thus described a typical embodiment of our invention, that which we claim as new and desire to secure by Letters Patent of the United States is:

1. Apparatus for making columnar grained articles including,
   a chill plate for controlling the cooling of the mold and alloy therein,
   a ceramic mold including an article portion having a cavity and a base portion having a cavity communicating with the cavity in the article portion,
   a spacer ring of preformed ceramic material separate from the mold and positioned on said chill plate and on which the mold is positioned with the base portion resting on the spacer,
   said spacer ring and mold providing a continuous cavity from the chill plate through the spacer and into and including the article portion cavity,
   means surrounding the mold for heating the mold to a temperature substantially as high as the melting point of the alloy to be cast, and
   the material and thickness of said spacer ring such that said ring is particularly resistant to damage by the steep thermal gradients developed during heating of the mold resting on the ring and simultaneous chilling of the ring by the chill plate, and said spacer ring serving to space the mold from the chill plate to reduce the thermal gradients therein.

2. Apparatus as in claim 1 in which the mold is thinner by elimination of the thermal gradients therein, thereby promoting faster cooling of the alloy.

3. Apparatus as in claim 1 including means for withdrawing the mold and chill plate from the mold heating means for radiation of heat from the filled mold.

4. Apparatus as in claim 3 in which the minimizing of thermal gradients permits a thinner mold by reducing thermal stresses therein, thereby increasing the transfer of heat through the mold as the mold is withdrawn from the heating means.

5. Apparatus as in claim 1 in which the mold material is a ceramic compatible to the alloy being cast but weak in resistance to thermal stresses.

6. Apparatus as in claim 5 in which the spacer ring wall is significantly thicker than the wall of the mold to produce adequate strength to resist the thermal stresses therein during heating of the mold.

7. In the manufacture of columnar grained articles in which a mold is placed on a chill plate for cooling the alloy and is withdrawn from a heating means surrounding the mold after the molten alloy is poured therein, the withdrawal and the function of the chill plate causing columnar grain growth in the alloy, the steps of providing a thin ceramic mold having a cavity therein for the formation of a cast article, said cavity being open at the base of the mold, providing a ring separate from the mold to rest on the chill plate and to support the mold above the plate, said ring spacing the mold from the chill plate and being made of a ceramic material and of such dimension as to be more resistant to the thermal gradient between the heated mold and the chill plate than the mold material, securing the mold and ring to the chill plate, heating the mold to a temperature above the melting point of the alloy, pouring the heated alloy into the mold and establishing an upwardly moving steep thermal gradient relative to the mold for solidification of the alloy in the mold in a columnar grained configuration.

8. The process of claim 7 in which the ring is substantially thicker than the mold to better resist the thermal stresses during heating and cooling of the mold.

9. The process of claim 7 in which the ring has an opening therein at least as large as the opening in the base of the mold and in alignment therewith.

10. The process of claim 7 in which the ring is structurally separate from the mold until assembly of the ring and mold on the chill plate and high enough to increase significantly the temperature of the base of the mold as the latter is heated.

* * * * *